United States Patent
Liao et al.

(10) Patent No.: US 8,643,104 B1
(45) Date of Patent: Feb. 4, 2014

(54) LATERAL DIFFUSION METAL OXIDE SEMICONDUCTOR TRANSISTOR STRUCTURE

(75) Inventors: Wei-Shan Liao, Erlun Township, Yunlin County (TW); An-Hung Lin, New Taipei (TW); Hong-Ze Lin, Hsinchu (TW); Bo-Jui Huang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/585,801

(22) Filed: Aug. 14, 2012

(51) Int. Cl.
H01L 29/66 (2006.01)
H01L 21/02 (2006.01)
H01L 29/02 (2006.01)
H01L 27/146 (2006.01)
H01L 29/861 (2006.01)

(52) U.S. Cl.
USPC ........... 257/343; 257/344; 257/127; 257/170; 257/409; 257/484; 257/605; 257/E29.02; 257/E29.256

(58) Field of Classification Search
USPC ......... 257/343, 344, 127, 170, 409, 848, 605, 257/E29.012, E29.256
See application file for complete search history.

(56) References Cited

U.S. PATENT DOCUMENTS

| | | | |
|---|---|---|---|
| 4,344,081 A | 8/1982 | Pao | |
| 4,396,999 A | 8/1983 | Malaviya | |
| 4,890,146 A * | 12/1989 | Williams et al. | 257/336 |
| 4,893,160 A | 1/1990 | Blanchard | |
| 4,918,333 A | 4/1990 | Anderson | |
| 4,958,089 A | 9/1990 | Fitzpatrick | |
| 5,040,045 A | 8/1991 | McArthur | |
| 5,268,589 A | 12/1993 | Dathe | |
| 5,296,393 A | 3/1994 | Smayling | |
| 5,326,711 A | 7/1994 | Malhi | |
| 5,346,835 A | 9/1994 | Malhi | |
| 5,430,316 A | 7/1995 | Contiero | |
| 5,436,486 A | 7/1995 | Fujishima | |
| 5,534,721 A | 7/1996 | Shibib | |
| 5,811,850 A | 9/1998 | Smayling | |
| 5,950,090 A | 9/1999 | Chen | |
| 5,998,301 A | 12/1999 | Pham | |
| 6,066,884 A | 5/2000 | Krutsick | |
| 6,144,538 A | 11/2000 | Chao | |
| 6,165,846 A | 12/2000 | Carns | |

(Continued)

OTHER PUBLICATIONS

Novgord_redistribution_of_dopant-Implanted_in_a_multilayer_structure_Phsyics_letters_Vol372_2008_03-pp1897-1903.pdf.*

Primary Examiner — Julio J Maldonado
Assistant Examiner — Moazzam Hossain
(74) Attorney, Agent, or Firm — Ding Yu Tan

(57) ABSTRACT

A lateral diffusion metal-oxide-semiconductor (LDMOS) transistor structure comprises a barrier layer, a semiconductor layer, a source, a first drain and a guard ring. The barrier layer with a first polarity is disposed in a substrate. The semiconductor layer with a second polarity is disposed on the barrier layer. The source has a first polarity region and a second polarity region both formed in the semiconductor layer. The first drain is disposed in the semiconductor layer and has a drift region with the second polarity. The guard ring with the first polarity extends downward from a surface of the semiconductor layer in a manner of getting in touch with the barrier layer and to surround the source and the drain, and is electrically connected to the source.

14 Claims, 3 Drawing Sheets

(56) References Cited

U.S. PATENT DOCUMENTS

| | | |
|---|---|---|
| 6,245,689 B1 | 6/2001 | Hao |
| 6,277,675 B1 | 8/2001 | Tung |
| 6,277,757 B1 | 8/2001 | Lin |
| 6,297,108 B1 | 10/2001 | Chu |
| 6,306,700 B1 | 10/2001 | Yang |
| 6,326,283 B1 | 12/2001 | Liang |
| 6,353,247 B1 | 3/2002 | Pan |
| 6,388,292 B1 | 5/2002 | Lin |
| 6,400,003 B1 | 6/2002 | Huang |
| 6,424,005 B1 | 7/2002 | Tsai |
| 6,514,830 B1 | 2/2003 | Fang |
| 6,521,538 B2 | 2/2003 | Soga |
| 6,614,089 B2 | 9/2003 | Nakamura |
| 6,713,794 B2 | 3/2004 | Suzuki |
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,819,184 B2 | 11/2004 | Pengelly |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh |
| 6,869,848 B2 | 3/2005 | Kwak |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,075,575 B2 | 7/2006 | Hynecek |
| 7,091,079 B2 | 8/2006 | Chen |
| 7,148,540 B2 | 12/2006 | Shibib |
| 7,214,591 B2 | 5/2007 | Hsu |
| 7,309,636 B2 | 12/2007 | Chen |
| 7,323,740 B2 | 1/2008 | Park |
| 7,358,567 B2 | 4/2008 | Hsu |
| 7,427,552 B2 | 9/2008 | Jin |
| 2003/0022460 A1 | 1/2003 | Park |
| 2004/0018698 A1 | 1/2004 | Schmidt |
| 2004/0070050 A1 | 4/2004 | Chi |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0261407 A1 | 11/2006 | Blanchard |
| 2006/0270134 A1 | 11/2006 | Lee |
| 2006/0270171 A1 | 11/2006 | Chen |
| 2007/0040212 A1 | 2/2007 | Cai |
| 2007/0041227 A1 | 2/2007 | Hall |
| 2007/0082440 A1 | 4/2007 | Shiratake |
| 2007/0132033 A1 | 6/2007 | Wu |
| 2007/0273001 A1 | 11/2007 | Chen |
| 2008/0160697 A1 | 7/2008 | Kao |
| 2008/0160706 A1 | 7/2008 | Jung |
| 2008/0185629 A1 | 8/2008 | Nakano |
| 2008/0203537 A1* | 8/2008 | Anderson et al. ............ 257/601 |
| 2008/0237703 A1* | 10/2008 | Lin et al. .................... 257/336 |
| 2008/0265292 A1* | 10/2008 | Huang et al. ................ 257/288 |
| 2008/0296655 A1 | 12/2008 | Lin |
| 2009/0020811 A1* | 1/2009 | Voldman ..................... 257/337 |
| 2009/0108348 A1 | 4/2009 | Yang |
| 2009/0111252 A1 | 4/2009 | Huang |
| 2009/0159966 A1 | 6/2009 | Huang |
| 2009/0278208 A1 | 11/2009 | Chang |
| 2009/0294865 A1 | 12/2009 | Tang |
| 2010/0006937 A1 | 1/2010 | Lee |
| 2010/0032758 A1 | 2/2010 | Wang |
| 2010/0096702 A1 | 4/2010 | Chen |
| 2010/0148250 A1 | 6/2010 | Lin |
| 2010/0148256 A1* | 6/2010 | Chang ........................ 257/343 |
| 2010/0213517 A1 | 8/2010 | Sonsky |
| 2011/0057263 A1 | 3/2011 | Tang |
| 2011/0079849 A1 | 4/2011 | Yan |
| 2011/0303977 A1* | 12/2011 | Huang et al. ................ 257/339 |
| 2012/0049277 A1* | 3/2012 | Lin et al. .................... 257/343 |
| 2013/0032862 A1* | 2/2013 | Su et al. ..................... 257/272 |

* cited by examiner

LATERAL DIFFUSION METAL OXIDE SEMICONDUCTOR TRANSISTOR STRUCTURE

FIELD OF THE INVENTION

The present invention relates to a semiconductor device, and more particularly to a lateral diffusion metal-oxide-semiconductor (LDMOS) transistor device.

BACKGROUND OF THE INVENTION

A LDMOS transistor device is characterized by low on-resistance and high breakdown voltage and is widespread applied in an integral part of modern day display panels, telecommunication systems, motor controllers, switch lock power supplies, inverters, and alike.

A typical LDMOS transistor device is an asymmetric power metal-oxide-semiconductor field effect transistor (MOSFET) having a gate and coplanar drain/source regions separated by a channel region which are fabricated in an epitaxial layer of a substrate. Wherein the drain region is formed in a drift region which is fabricated by a lightly doped drain (LDD) implant process and used to isolate the drain and the channel regions. The drain region and the gate are laterally separated by a field oxide (FOX). While the LDMOS transistor device is operated in high voltage, electric field density around the drain region can be reduced due to the existence of the drift region and the FOX, such that the breakdown voltage of the LDMOS transistor device can be improved.

However, as the circuit critical dimensions continuing to shrinkage, parasitic circuit elements formed in the LDMOS transistor device may be more likely punch through due to the converse parasitic diode effect. Therefore, there is a need of providing an improved LDMOS transistor structure in order to obviate the drawbacks encountered from the prior art and improve the performance of the semiconductor device.

SUMMARY OF THE INVENTION

In accordance with an aspect, the present invention provides a LDMOS transistor structure comprising a barrier layer, a semiconductor layer, a source, a first drain and a guard ring. The barrier layer with a first polarity is disposed in a substrate. The semiconductor layer with a second polarity is disposed on the barrier layer. The source has a first polarity region and a second polarity region both disposed in the semiconductor layer. The first drain is disposed in the semiconductor layer and has a drift region with the second polarity. The guard ring with the first polarity extends downward from a surface of the semiconductor layer in a manner of getting in touch with the barrier layer and surrounding the source and the drain, and is electrically connected to the source.

In one embodiment of the present invention, the first polarity is n-type conductivity, and the second polarity is p-type conductivity.

In one embodiment of the present invention, the barrier layer comprises a tri-layer phosphorous/antimony/phosphorous (P/Sb/P) doping structure.

In one embodiment of the present invention, the first polarity region and a second polarity region are disposed in an n-type well which is disposed in the semiconductor layer in a manner of getting in touch with the barrier layer.

In one embodiment of the present invention, the n-type well comprises an n-body region and a high-voltage drift N-well (HVDNW) region, wherein the first polarity region and a second polarity region are disposed in the n-body region, and the n-body region is disposed in the HVDNW region.

In one embodiment of the present invention, the drift region has a doping concentration substantially greater than that of the semiconductor layer.

In one embodiment of the present invention, the LDMOS transistor structure further comprises a first gate disposed on the semiconductor layer and partially straddling over a first field oxide (FOX), wherein the first gate and the first drain are separated from each other by the first FOX.

In one embodiment of the present invention, the LDMOS transistor structure further comprises a second drain disposed in the semiconductor layer and a second gate disposed over the semiconductor layer, wherein the second gate partially straddles over a second FOX by which the second gate and the second drain are separated from each other.

In one embodiment of the present invention, the first drain and the second drain constitute a symmetric structure against the source, and the source serves as a common source of the first drain and the second drain.

In one embodiment of the present invention, the second polarity region is separated into two parts by the first polarity region.

In one embodiment of the present invention, the guard ring has a concentration decreasing gradually from a top surface of the semiconductor layer to the barrier.

In one embodiment of the present invention, the guard ring is electrically connected to the source via an interconnection or a wire.

In one embodiment of the present invention, the first polarity is p-type conductivity, and the second polarity is n-type conductivity. In one embodiment of the present invention, the barrier layer comprises a tri-layer boron/Indium/boron (B/In/B) doping structure.

In accordance with the aforementioned embodiments of the present invention, a LDMOS transistor structure is provided, wherein a guard ring is formed in a semiconductor layer in a manner of getting in touch with a barrier layer disposed in the semiconductor layer and surrounding a source and a drain. Since the guard ring and the barrier have the same polarity and both of them are electrically connected with the source, thus an isolation structure with an electric potential identical to that of the source is formed in a manner of surrounding the LDMOS transistor, so as to prevent the parasitic circuit elements formed in the LDMOS transistor device from latching up with other integrated circuit element, such that the device punch-through problems due to critical dimension shrinkage can be solved. Meanwhile the on-resistance of the LDMOS transistor device can be decreased, the breakdown voltage of the LDMOS transistor device can be increased, and the performance of the LDMOS transistor device can be improved.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

A LDMOS transistor structure is provided by the present invention to solve device punch-through problems due to critical dimension shrinkage. The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
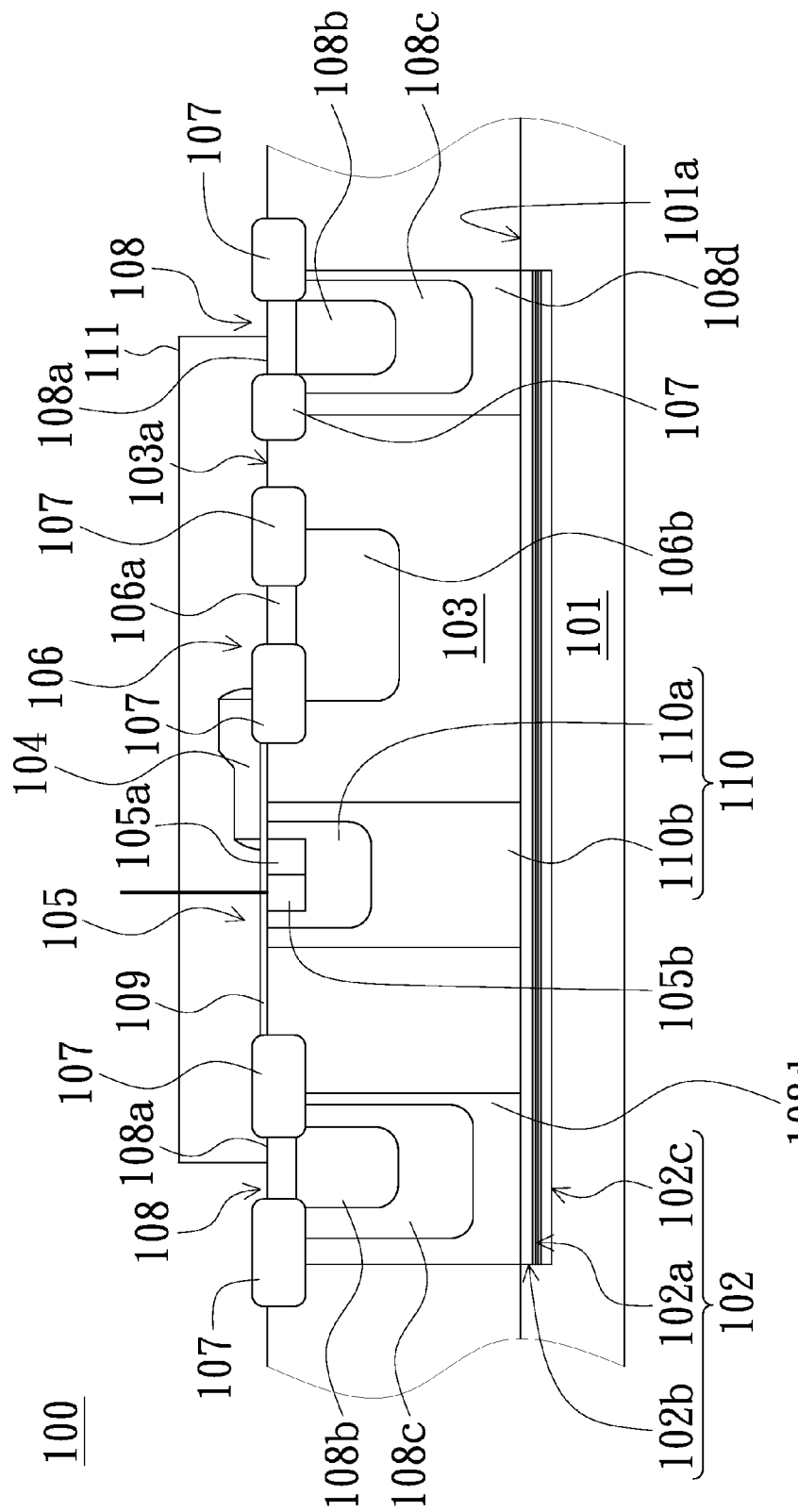
FIG. 1 illustrates a cross-sectional view of a LDMOS transistor structure in accordance with one embodiment of the present invention.

FIG. 1 illustrates a cross-sectional view of a LDMOS transistor structure 100 in accordance with one embodiment of the present invention. The LDMOS transistor structure 100 comprises a substrate 101, a barrier layer 102, a p-type semiconductor layer 103, a gate 104, a source 105, a drain 106, a FOX 107, a guard ring 108 and a gate oxide layer 109.

The substrate 101 is a semiconductor substrate preferably is a silicon substrate. The barrier layer 102 is an n-type doping layer formed in the substrate 101. In some embodiments of the present invention, the barrier layer 102 extends downward in to the substrate 101 from a surface 101a of the substrate 101; and the barrier layer 102 comprises phosphorous and antimony dopants. In the present embodiment, the barrier layer 102 has a tri-layer P/Sb/P doping structure; the barrier layer 102 includes an antimony doping layer 102a and two phosphorous doping layers 102b and 102c; wherein the antimony doping layer 102a has a doping concentration greater than that of the two phosphorous doping layers 102b and 102c sandwiching the antimony layer 102a.

In some embodiments, the barrier layer 102 has a thickness about 3 μm, and the tri-layer P/Sb/P doping structure is formed by at least three separated doping processes which are performed to implant phosphorous dopants, antimony dopants and phosphorous dopants in sequence into the substrate 101. Alternatively, in some other embodiments, the tri-layer P/Sb/P doping structure may be formed by steps as follows: A phosphorous doping layer is firstly formed in the substrate 101, and the antimony doping layer 102a is then formed in the phosphorous doping layer by implanting antimony dopants into the phosphorous doping layer, so as to divide the phosphorous doping layer into two parts (referred as the two phosphorous doping layers 102b and 102c).

The p-type semiconductor layer 103 is an epitaxial layer formed on the substrate 101, wherein the epitaxial layer is disposed over and in contact with the barrier layer 102. In the present embodiment, the p-type semiconductor layer 103 is doped with p-type dopants, such as boron ions, and has a thickness about 7 μm.

The source 105 has a p-type region 105a and an n-type region 105b disposed in an n-type well 110 formed in the p-type semiconductor layer 103 in a manner of getting in touch with the barrier layer 102. In some embodiments of the present invention, the n-type well 110 comprises an n-body region (referred as N-Body region) 110a, a high-voltage drift N-well (referred as HVDNW region) 110, wherein the N-Body region 110a is disposed in the HVDNW region 110b, and the p-type region 105a and the n-type region 105b are disposed in the N-Body region 110a. In the present embodiment, the n-type region 105b is a high concentration n-type doping region (referred as N+ region 105b), and the p-type region 105a is a high concentration p-type doping region (referred as P+ region 105a). The N+ region 105b has a doping concentration substantially greater than that of the N-Body region 110a, and the N-Body region 110a has a doping concentration substantially greater than that of the HVDNW region 110b.

The drain 106 is formed in the p-type semiconductor layer 103 and has a high concentration p-type doping region (referred as P+ region) 106a and a p-type drift region (referred as P-Drift region) 106b. Wherein the P+ region 106a is disposed in the P-Drift region 106b and has a doping concentration substantially greater than that of the P-Drift region 106b. Besides, the P-Drift region 106b has a doping concentration substantially greater than that of the p-type semiconductor layer 103.

The gate oxide layer 109 is blanket over the source 105 and a portion of the p-type semiconductor layer 103. The FOX 107 is formed in the p-type semiconductor layer 103 and protrudes beyond a top surface 103a of the p-type semiconductor layer 103. The gate 104 is disposed on the gate oxide layer 109 and partially straddles over the FOX 107, wherein the gate 104 and the drain 106 are separated from each other by the FOX 107.

The guard ring 108 is an n-type doping region extending downward in to the p-type semiconductor layer 103 from the top surface 103a of the p-type semiconductor layer 103 in a manner of getting in touch with the barrier layer 102 and surrounding the source 105 and the drain 106. In some embodiments of the present invention, the guard ring 108 is electrically connected to the source 105 via a conductive structure 111, such as an interconnection or a wire. In some embodiments of the present invention, the guard ring 108 comprises a high concentration n-type doping region (referred as N+ region) 108a, an n-type well (referred as N-Well region) 108b, an n-type drift region (referred as N-Drift region) 108c and a high-voltage drift N-well (referred as HVDNW region) 108d.

Wherein the N+ region 108a extends downwards in to the N-Well region 108b from the top surface 103a of the p-type semiconductor layer 103; the N-Well region 108b is disposed in the N-Drift region 108c; and the N-Drift region 108c is disposed in the HVDNW region 108d. Besides, the N+ region 108a has a doping concentration substantially greater than that of the N-Well region 108b; the doping concentration of the N-Well region 108b is substantially greater than that of the N-Drift region 108c; and the doping concentration of the N-Drift region 108c is substantially greater than that of the HVDNW region 108d. In other words, the guard ring 108 has a concentration decreasing gradually from the top surface 103a of the semiconductor layer 103 to the barrier 102.

Since the guard ring 108 and the barrier layer 102 has identical polarity and both of them are electrically connected to the source 105, thus an isolation structure with an electric potential identical to that of the source 105 is formed in the p-type semiconductor layer 103 so as to prevent the parasitic circuit elements formed in the p-type semiconductor layer 103 from latching up with other integrated circuit element (not shown). Meanwhile the on-resistance of the LDMOS transistor structure 100 can be decreased, the breakdown voltage of the LDMOS transistor structure 100 can be increased, and the performance of the LDMOS transistor structure 100 can be improved.

Figure 2:
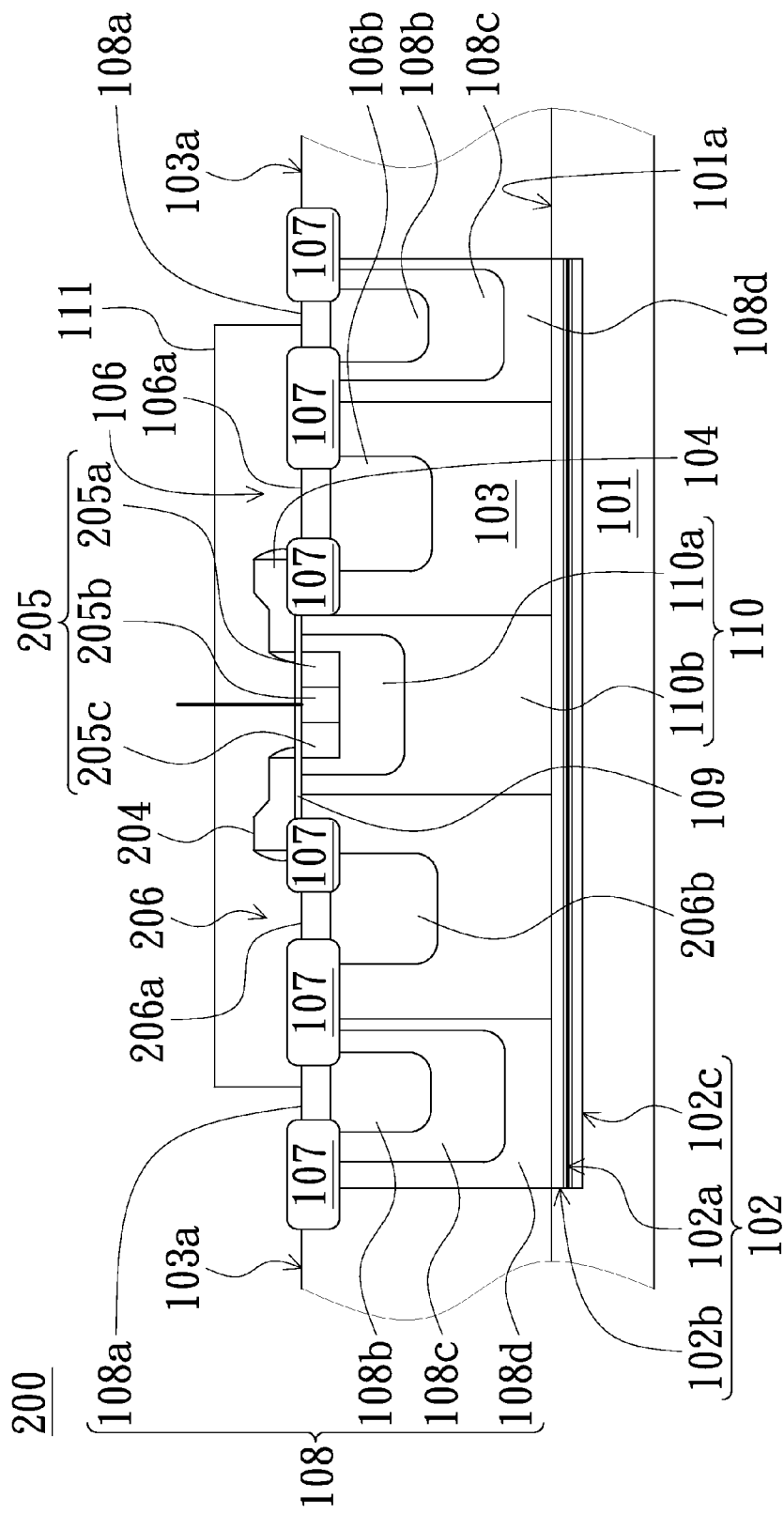
FIG. 2 illustrates a cross-sectional view of a LDMOS transistor structure in accordance with another embodiment of the present invention.

FIG. 2 illustrates a cross-sectional view of a LDMOS transistor structure 200 in accordance with another embodiment of the present invention. The physical structure of the LDMOS transistor structure 200 is generally similar to that of the LDMOS transistor structure 100 depicted in FIG. 1. The difference therebetween is that the LDMOS transistor structure 200 further comprises a gate 204 and a drain 206. For the purpose of clear description, thereinafter, the same elements may be indicated by the same numbers.

In the present embodiment, the drain 106 and 206 constitute a symmetric structure against the source 105, and the source 205 serves as the common source thereof. The source 205 comprises an n-type region 205b and two p-type regions 205a and 205c disposed in the n-type well 110 formed in the p-type semiconductor layer 103, wherein the two p-type regions 205a and 205c are separated by the n-type region 205b. The n-type region 205b is a high concentration n-type doping region (referred as N+ region 205b), and these two p-type region 205a and 205c are high concentration p-type doping regions (referred as P+ region 205a and 205c). The N+ region 205b has a doping concentration substantially greater than that of the N-Body region 110a.

The drain 206 is formed in the p-type semiconductor layer 103 and has a high concentration p-type doping region (referred as P+ region) 206a and a p-type drift region (referred as P-Drift region) 206b. Wherein the P+ region 206a is disposed in the P-Drift region 206b and has a doping concentration substantially greater than that of the P-Drift region 206b. Besides, the P-Drift region 206b has a doping concentration substantially greater than that of the p-type semiconductor layer 103. The gate 204 is disposed on the gate oxide layer 109 and partially straddles over the FOX 107, wherein the gate 204 and the drain 206 are separated from each other by the FOX 107.

Along the same line as the LDMOS transistor structure 100 indicated, an isolation structure with an electric potential identical to that of the source 205 is formed in the p-type semiconductor layer 103, so as to prevent parasitic circuit elements formed therein from latching up with other integrated circuit element (not shown). Meanwhile the on-resistance of the LDMOS transistor structure 200 can be decreased, the breakdown voltage of the LDMOS transistor structure 200 can be increased, and the performance of the LDMOS transistor structure 200 can be improved.

It should be appreciated that the p-channel transistors described in the aforementioned embodiments are just illustrative; the applying scope of the present invention may not be limited. Thus the features and advantages of the present invention may be further applied by an n-channel transistor.

Figure 3:
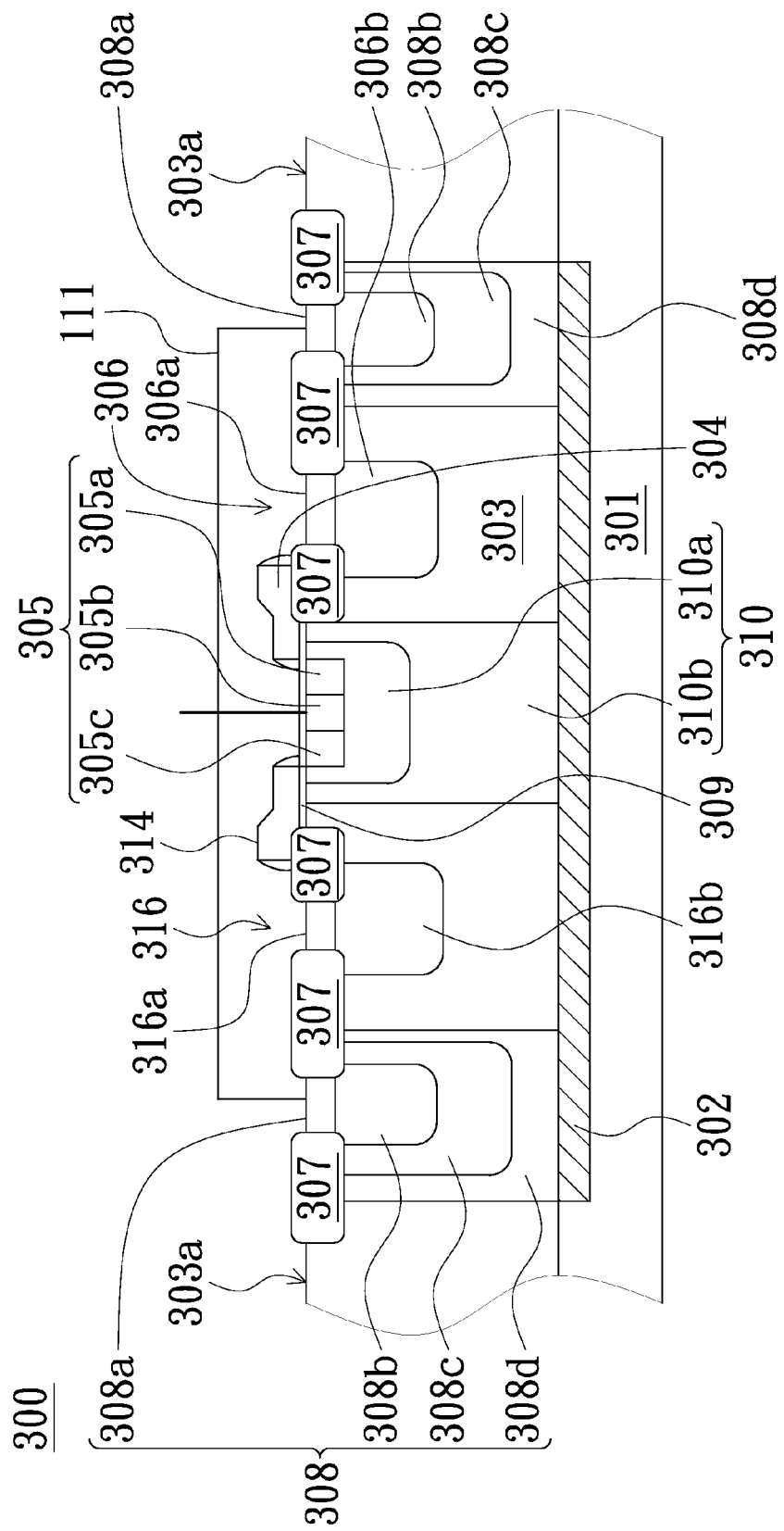
FIG. 3 illustrates a cross-sectional view of a LDMOS transistor structure in accordance with further embodiment of the present invention.

FIG. 3 illustrates a cross-sectional view of a LDMOS transistor structure 300 in accordance with further embodiment of the present invention. The physical structure of the LDMOS transistor structure 300 is generally similar to that of the LDMOS transistor structure 200 depicted in FIG. 2. The difference there between is that the LDMOS transistor structure 300 is an n-channel transistor structure rather than a p-channel transistor structure.

The LDMOS transistor structure 300 comprises a substrate 301, a barrier layer 302, an n-type semiconductor layer 303, two gates 304 and 314, a source 305, two drains 306 and 316, a FOX 307, a guard ring 308 and a gate oxide layer 309.

The barrier layer 302 is an n-type doping layer formed in the substrate 101, wherein the barrier layer 302 comprises indium and boron dopants. Although the barrier layer 302 of the present embodiment is illustrated as a single layer structure (see FIG. 3), in some other embodiments of the present invention, the barrier layer 302 may otherwise comprise a tri-layer B/In/B doping structure, wherein the indium doping layer (not shown) has a doping concentration greater than that of the two boron doping layers (not shown) sandwiching the indium layer.

The n-type semiconductor layer 303 is an epitaxial layer formed on the substrate 301, wherein the epitaxial layer is disposed over and in contact with the barrier 302.

The source 305 comprises an p-type region 305b and two n-type regions 305a and 305c disposed in an p-type well 310 formed in the n-type semiconductor layer 303, wherein the p-type well 310 comprises an p-body region (referred as P-Body region) 310a, a high-voltage drift p-well (referred as HVDPW region) 310b. The P-Body region 310a is disposed in the HVDPW region 310b, and the two n-type region 305a and 305c and the p-type region 305b are disposed in the P-Body region 310a, wherein the two n-type regions 305a and 305c are separated by the p-type region 305b. In the present embodiment, the p-type region 305b is a high concentration p-type doping region (referred as P+ region 305b), these two n-type region 305a and 305c are high concentration n-type doping regions (referred as N+ region 305a and 305c); the P+ region 305b has a doping concentration substantially greater than that of the P-Body region 310a, and the concentration of the P-Body region 310a is substantially greater than that of the HVDPW region 310b.

The drain 306 is formed in the n-type semiconductor layer 303 and has a high concentration n-type doping region (referred as N+ region) 306a and an n-type drift region (referred as N-Drift region) 306b, wherein the N+ region 306a is disposed in the N-Drift region 306b and has a doping concentration substantially greater than that of the N-Drift region 306b. Besides, the N-Drift region 306b has a doping concentration substantially greater than that of the n-type semiconductor layer 303.

The drain 316 is formed in the n-type semiconductor layer 303 and has a high concentration n-type doping region (referred as N+ region) 316a and an n-type drift region (referred as N-Drift region) 316b, wherein the N+ region 316a is disposed in the N-Drift region 316b and has a doping concentration substantially greater than that of the N-Drift region 316b. Besides, the N-Drift region 316b has a doping concentration substantially greater than that of the n-type semiconductor layer 303.

The gate oxide layer 309 is blanket over the source 305 and a portion of the n-type semiconductor layer 303. The FOX 307 is formed in the n-type semiconductor layer 303 and protrudes beyond a top surface 303a of the n-type semiconductor layer 303. The gates 304 and 314 are respectively disposed on the gate oxide layer 309 and partially straddle over the FOX 307 by which the gate 304 and the drain 306 are separated from each other and so do the gate 314 and the drain 316.

The guard ring 308 is a p-type doping region extending downward in to the n-type semiconductor layer 303 from the top surface 303a of the n-type semiconductor layer 303 in a manner of getting in touch with the barrier layer 302 and surrounding the source 305 and the drains 306 and 316. Wherein, the guard ring 308 is electrically connected to the source 305 via a conductive structure 311, such as an interconnection or a wire. In some embodiments of the present invention, the guard ring 308 comprises a high concentration p-type doping region (referred as P+ region) 308a, a p-type well (referred as P-Well region) 308b, a p-type drift region (referred as P-Drift region) 308c and a high-voltage drift p-well (referred as HVDPW region) 308d.

Wherein the P+ region 308a extends downwards in to the P-Well region 308b from the top surface 303a of the n-type semiconductor layer 303; the P-Well region 308b is disposed in the P-Drift region 308c; and the P-Drift region 308c is disposed in the HVDPW region 308d. Besides, the P+ region 308a has a doping concentration substantially greater than that of the P-Well region 308b; the doping concentration of the P-Well region 308b is substantially greater than that of the P-Drift region 308c; and the doping concentration of the P-Drift region 308c is substantially greater than that of the HVDPW region 308d.

Since the guard ring 308 and the barrier layer 302 has identical polarity and both of them are electrically connected to the source 305, thus an isolation structure with an electric potential identical to that of the source 305 is formed in the n-type semiconductor layer 303, so as to prevent parasitic circuit elements formed in the n-type semiconductor layer 303 from latching up with other integrated circuit element (not shown). Meanwhile the on-resistance of the LDMOS transistor structure 300 can be decreased, and the breakdown voltage of the LDMOS transistor structure 300 can be increased, and the performance of the LDMOS transistor structure 300 can be improved.

In accordance with the aforementioned embodiments of the present invention, a LDMOS transistor structure is provided, wherein a guard ring is formed in a semiconductor layer in a manner of getting in touch with a barrier layer disposed in the semiconductor layer and surrounding a source and a drain. Since the guard ring and the barrier layer has the same polarity and both of them are electrically connected with the source, thus an isolation structure with an electric potential identical to that of the source is formed in a manner of surrounding the LDMOS transistor, so as to prevent the parasitic circuit elements formed in the LDMOS transistor device from latching up with other integrated circuit element, such that, the device punch-through problems due to critical dimension shrinkage can be solved. Meanwhile the on-resistance of the LDMOS transistor device can be decreased, the breakdown voltage of the LDMOS transistor device can be increased, and the performance of the LDMOS transistor device can be improved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A lateral diffusion metal-oxide-semiconductor (LDMOS) transistor structure comprising:
   a barrier layer with a first polarity consisting of two first doping layers sandwiching a second doping layer disposed in a substrate, wherein the second doping layer has a doping concentration greater than that of the two first doping layers;
   a semiconductor layer with a second polarity, disposed on the barrier layer;
   a source, having a first polarity region and a second polarity region disposed in the semiconductor layer;
   a first drain, disposed in the semiconductor layer and having a drift region with the second polarity; and
   a guard ring with the first polarity, extending downward from a surface of the semiconductor layer in a manner of getting in touch with the barrier layer and surrounding the source and the drain, and electrically connected to the source.

2. The LDMOS transistor structure according to claim 1, wherein the first polarity is n-type conductivity; and the second polarity is p-type conductivity.

3. The LDMOS transistor structure according to claim 2, wherein the barrier layer comprises a tri-layer phosphorous/antimony/phosphorous (P/Sb/P) doping structure.

4. The LDMOS transistor structure according to claim 2, wherein the first polarity region and a second polarity region are disposed in an n-type well which is disposed in the semiconductor layer in a manner of getting in touch with the barrier layer.

5. The LDMOS transistor structure according to claim 4, wherein the n-type well comprises an n-body region and a high-voltage drift N-well (HVDNW) region; the first polarity region and a second polarity region are disposed in the n-body region, and the n-body region is disposed in the HVDNW region.

6. The LDMOS transistor structure according to claim 1, wherein the drift region has a doping concentration substantially greater than that of the semiconductor layer.

7. The LDMOS transistor structure according to claim 1, further comprising a first gate disposed on the semiconductor layer and partially straddling over a first field oxide (FOX), wherein the first gate and the first drain are separated from each other by the first FOX.

8. The LDMOS transistor structure according to claim 7, further comprising:
   a second drain, disposed in the semiconductor layer; and
   a second gate, disposed over the semiconductor layer and partially straddling over a second FOX, wherein the second gate and the second drain are separated from each other by the second FOX.

9. The LDMOS transistor structure according to claim 8, wherein the first drain and the second drain constitute a symmetric structure against the source, and the source serves as a common source thereof.

10. The LDMOS transistor structure according to claim 9, wherein the second polarity region is separated into two parts by the first polarity region.

11. The LDMOS transistor structure according to claim 1, wherein the guard ring has a concentration decreasing gradually from a top surface of the semiconductor layer to the barrier.

12. The LDMOS transistor structure according to claim 1, the guard ring is electrically connected to the source via an interconnection or a wire.

13. The LDMOS transistor structure according to claim 1, wherein the first polarity is p-type conductivity; and the second polarity is n-type conductivity.

14. The LDMOS transistor structure according to claim 13, wherein the barrier layer comprises a tri-layer boron/Indium/boron (B/In/B) doping structure.

* * * * *